(12) United States Patent
Onishi

(10) Patent No.: US 10,951,181 B2
(45) Date of Patent: Mar. 16, 2021

(54) METHODS AND APPARATUS FOR AN AMPLIFIER CIRCUIT

(71) Applicant: SEMICONDUCTOR COMPONENTS INDUSTRIES, LLC, Phoenix, AZ (US)

(72) Inventor: Akinobu Onishi, Ota (JP)

(73) Assignee: SEMICONDUCTOR COMPONENTS INDUSTRIES, LLC, Phoenix, AZ (US)

(*) Notice: Subject to any disclaimer, the term of this patent is extended or adjusted under 35 U.S.C. 154(b) by 288 days.

(21) Appl. No.: 16/150,951

(22) Filed: Oct. 3, 2018

(65) Prior Publication Data

US 2020/0112288 A1 Apr. 9, 2020

(51) Int. Cl.
| | | |
|---|---|---|
| H04B 15/00 | (2006.01) | |
| H03F 3/185 | (2006.01) | |
| H03F 3/213 | (2006.01) | |
| H03F 1/32 | (2006.01) | |
| H03M 1/08 | (2006.01) | |
| H03M 1/66 | (2006.01) | |
| H03F 3/45 | (2006.01) | |
| H03M 1/06 | (2006.01) | |

(52) U.S. Cl.
CPC .......... *H03F 3/185* (2013.01); *H03F 1/3264* (2013.01); *H03F 3/213* (2013.01); *H03F 3/45636* (2013.01); *H03M 1/0614* (2013.01); *H03M 1/0863* (2013.01); *H03M 1/66* (2013.01); *H03F 2200/03* (2013.01)

(58) Field of Classification Search
None
See application file for complete search history.

(56) References Cited

U.S. PATENT DOCUMENTS

| | | | |
|---|---|---|---|
| 2004/0233085 A1 | 11/2004 | Fukuda | |
| 2009/0261899 A1* | 10/2009 | Gomez | H03G 5/28 330/2 |
| 2013/0243223 A1* | 9/2013 | Sakai | H04R 5/04 381/120 |
| 2018/0270588 A1* | 9/2018 | Saman | H04R 19/005 |
| 2020/0106401 A1* | 4/2020 | Jones | H03F 3/3069 |

* cited by examiner

*Primary Examiner* — Olisa Anwah
(74) *Attorney, Agent, or Firm* — The Noblitt Group, PLLC; Hettie L. Haines

(57) ABSTRACT

Various embodiments of the present technology may comprise methods and apparatus for an amplifier circuit. Methods and apparatus for an amplifier circuit according to various aspects of the present invention may be utilized in a digital-to-analog converter. The amplifier circuit may comprise a first operational amplifier with a feedback circuit. The feedback circuit may comprise an inverting amplifier circuit.

20 Claims, 21 Drawing Sheets

METHODS AND APPARATUS FOR AN AMPLIFIER CIRCUIT

BACKGROUND OF THE TECHNOLOGY

Many electrical systems utilize a digital-to-analog converter (DAC) to convert a digital signal into an analog signal. The DAC typically employs one or more amplifier circuits to achieve a desired output. In many cases, it is desired that the DAC perform at a high standard, which may be measured according to the DACs total harmonic distortion (THD) and signal-to-noise ratio (SNR). For example, a high-performance DAC may have an SNR greater than 105 dB and a THD less than −90 dB. DACs, however, are sensitive to changes in the supply voltage, temperature changes, and variations in the manufacturing process. As a result, the total harmonic distortion and the signal-to-noise ratio are not stable when such changes occur. In addition, due to process miniaturization, the noise characteristics and the current-voltage characteristics of the transistors that are used to form the DAC deteriorate as the transistors are made smaller and smaller.

SUMMARY OF THE INVENTION

Various embodiments of the present technology may comprise methods and apparatus for an amplifier circuit. Methods and apparatus for an amplifier circuit according to various aspects of the present invention may be utilized in a digital-to-analog converter. The amplifier circuit may comprise a first operational amplifier with a feedback circuit. The feedback circuit may comprise an inverting amplifier circuit.

BRIEF DESCRIPTION OF THE DRAWING FIGURES

A more complete understanding of the present technology may be derived by referring to the detailed description when considered in connection with the following illustrative figures. In the following figures, like reference numbers refer to similar elements and steps throughout the figures.

Figure 5:
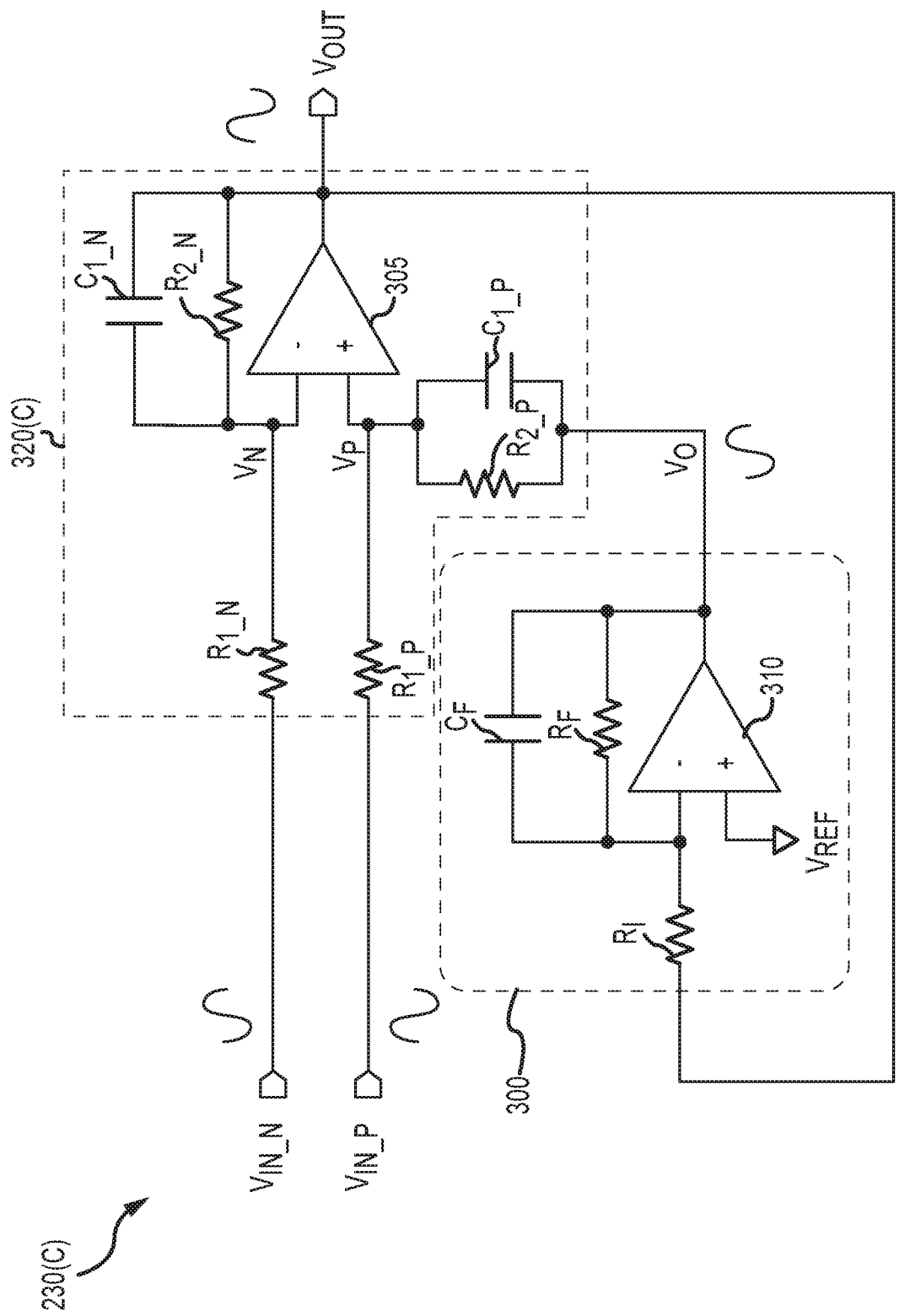
Figure 6:
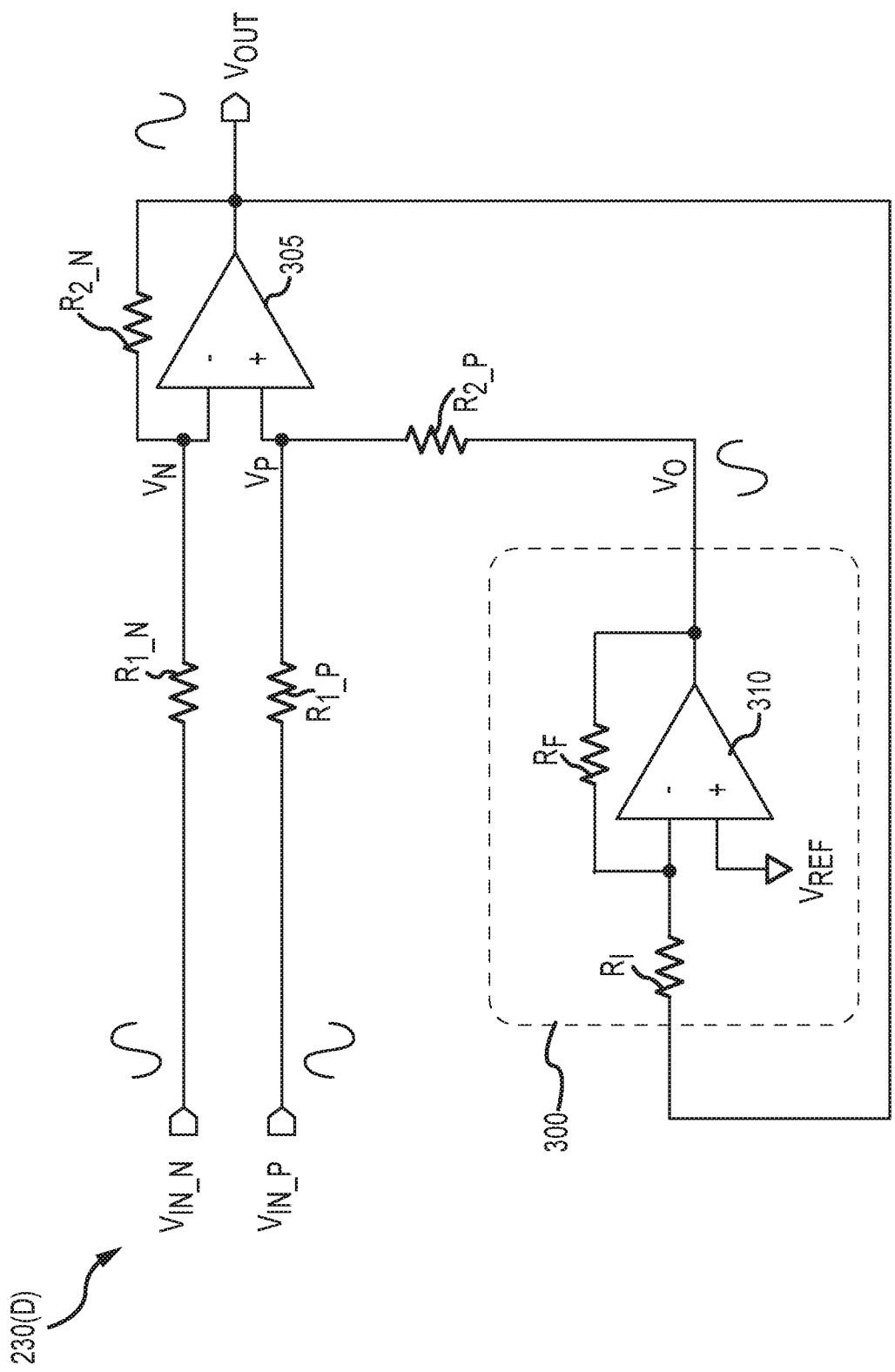
Figure 7:
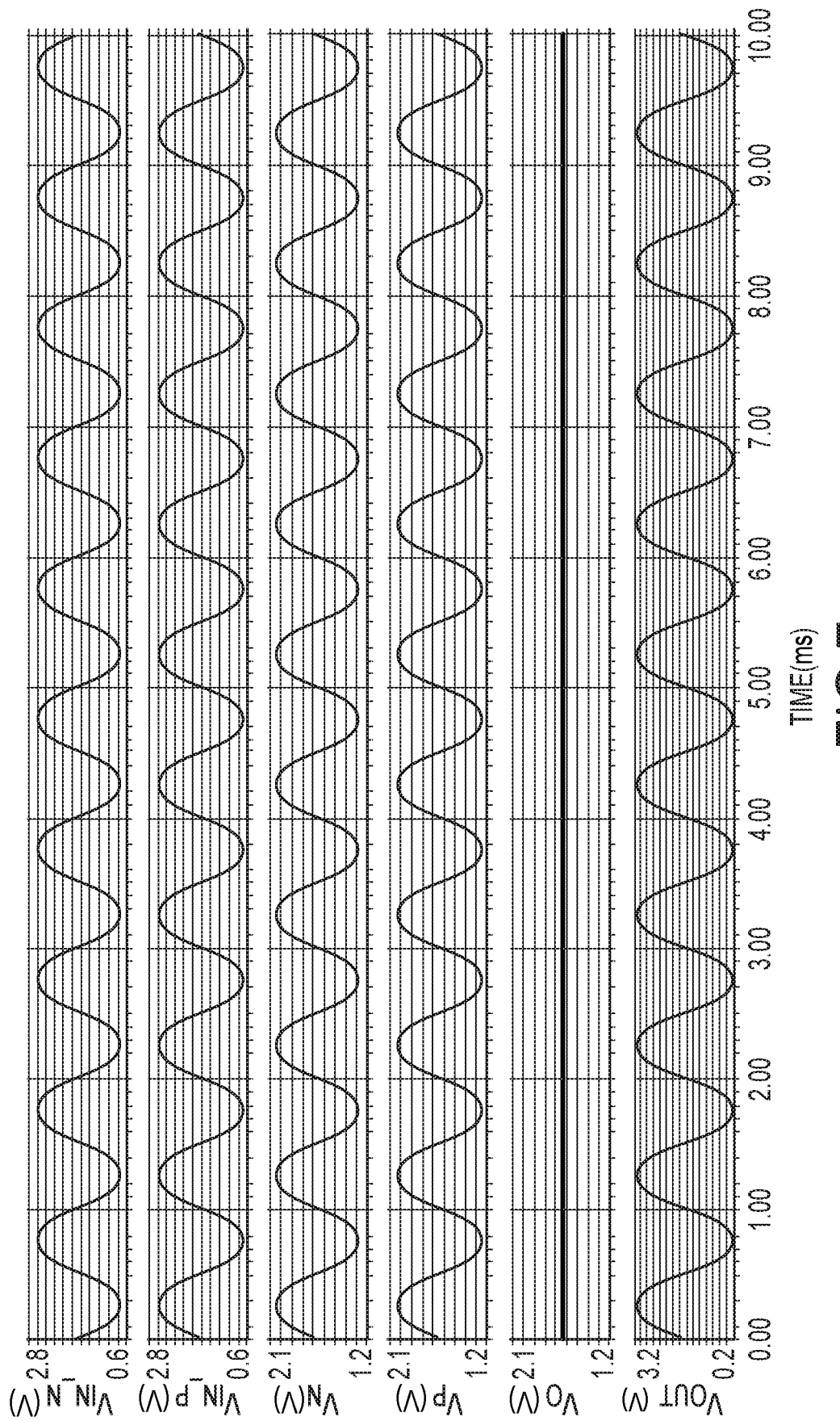
Figure 8:
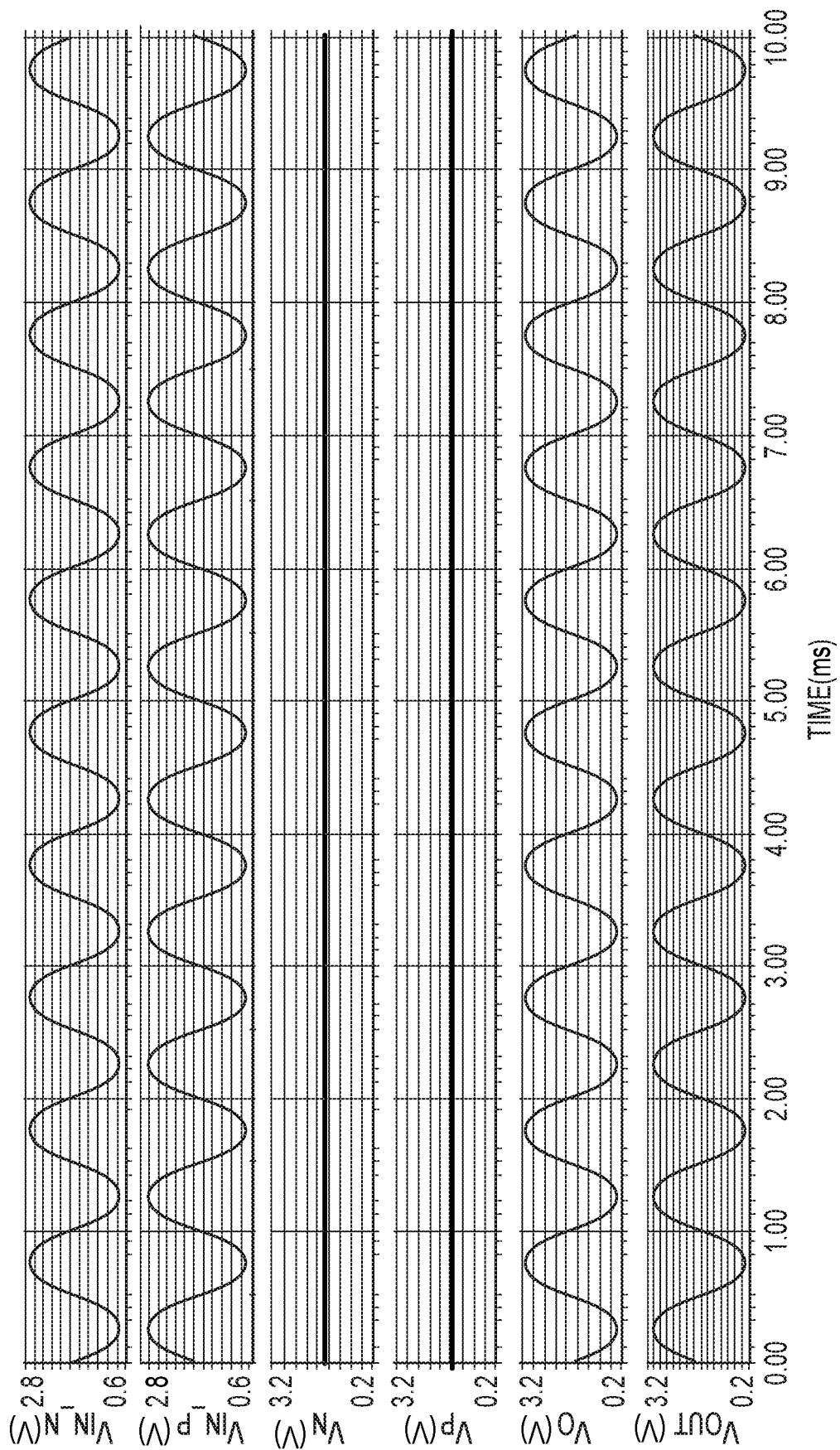
Figure 9:
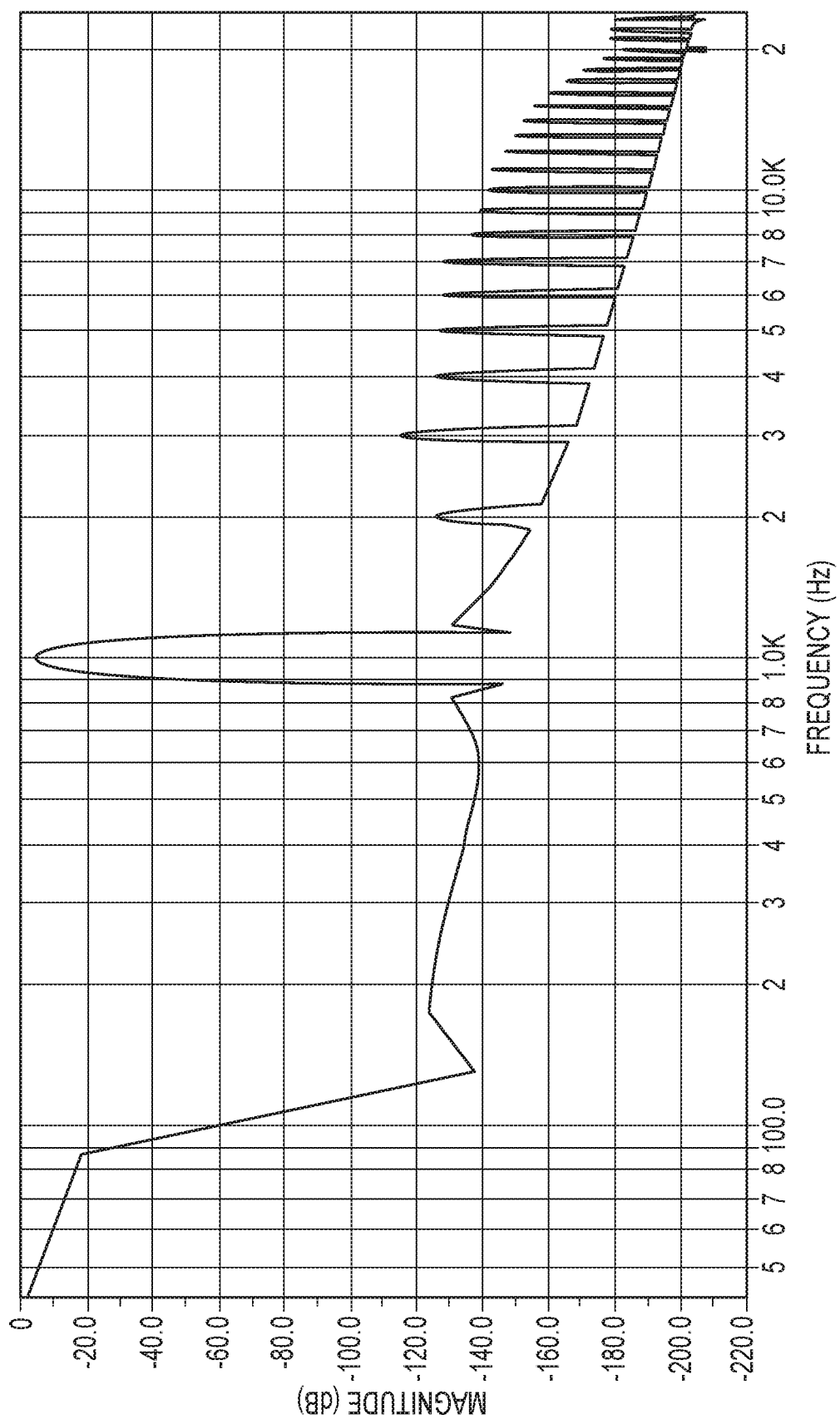
Figure 10:
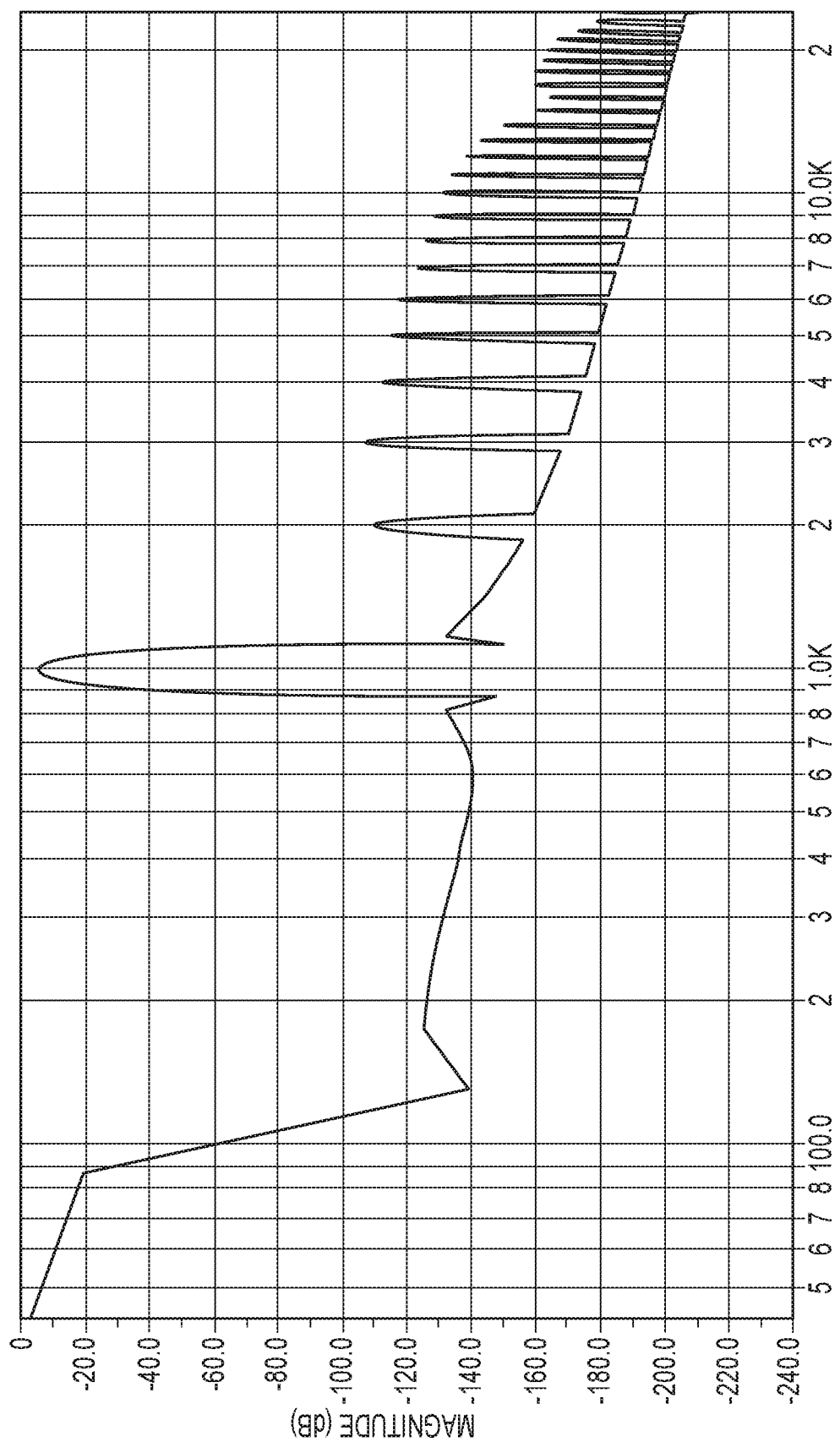
Figure 11:
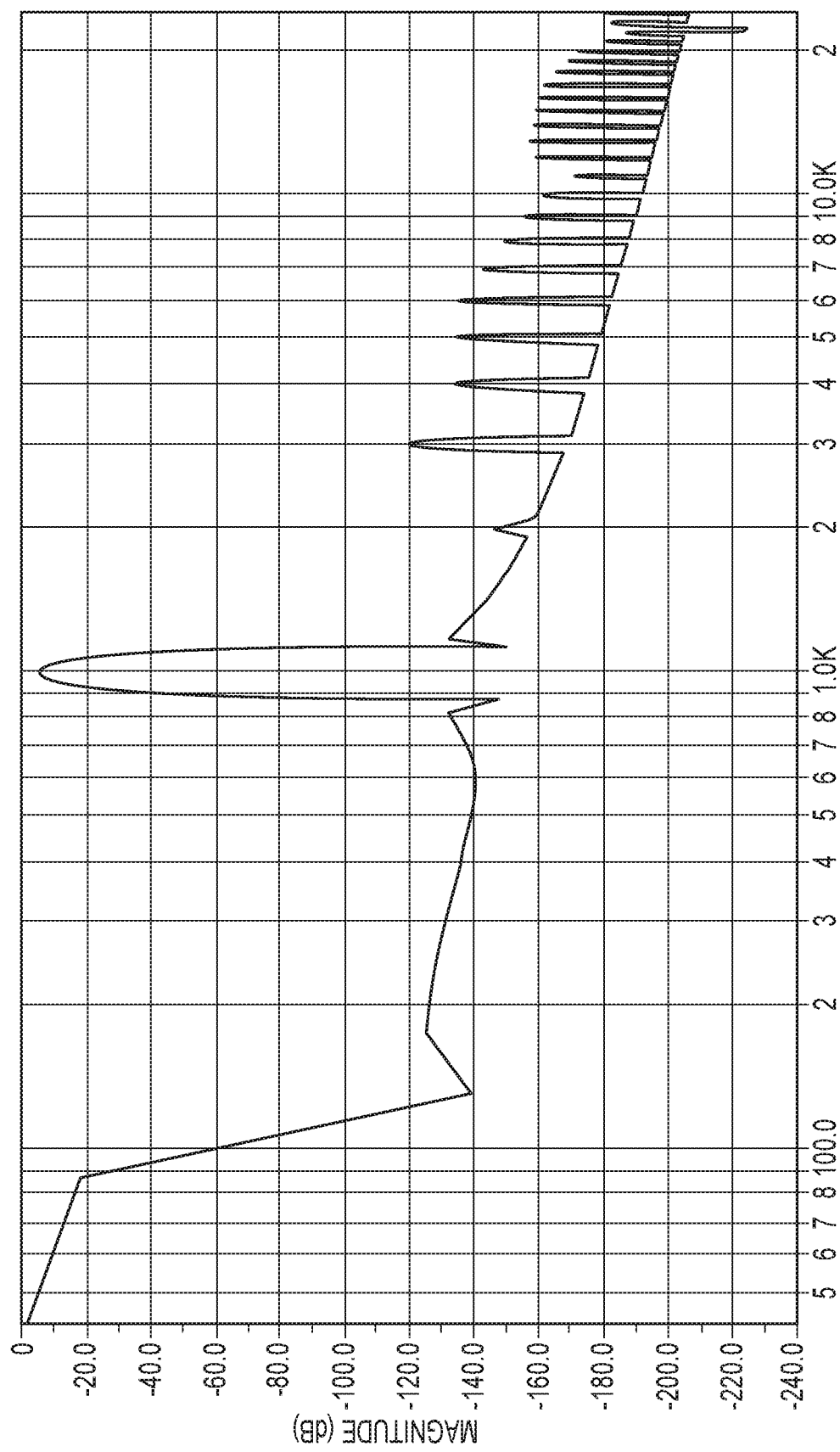
Figure 12:
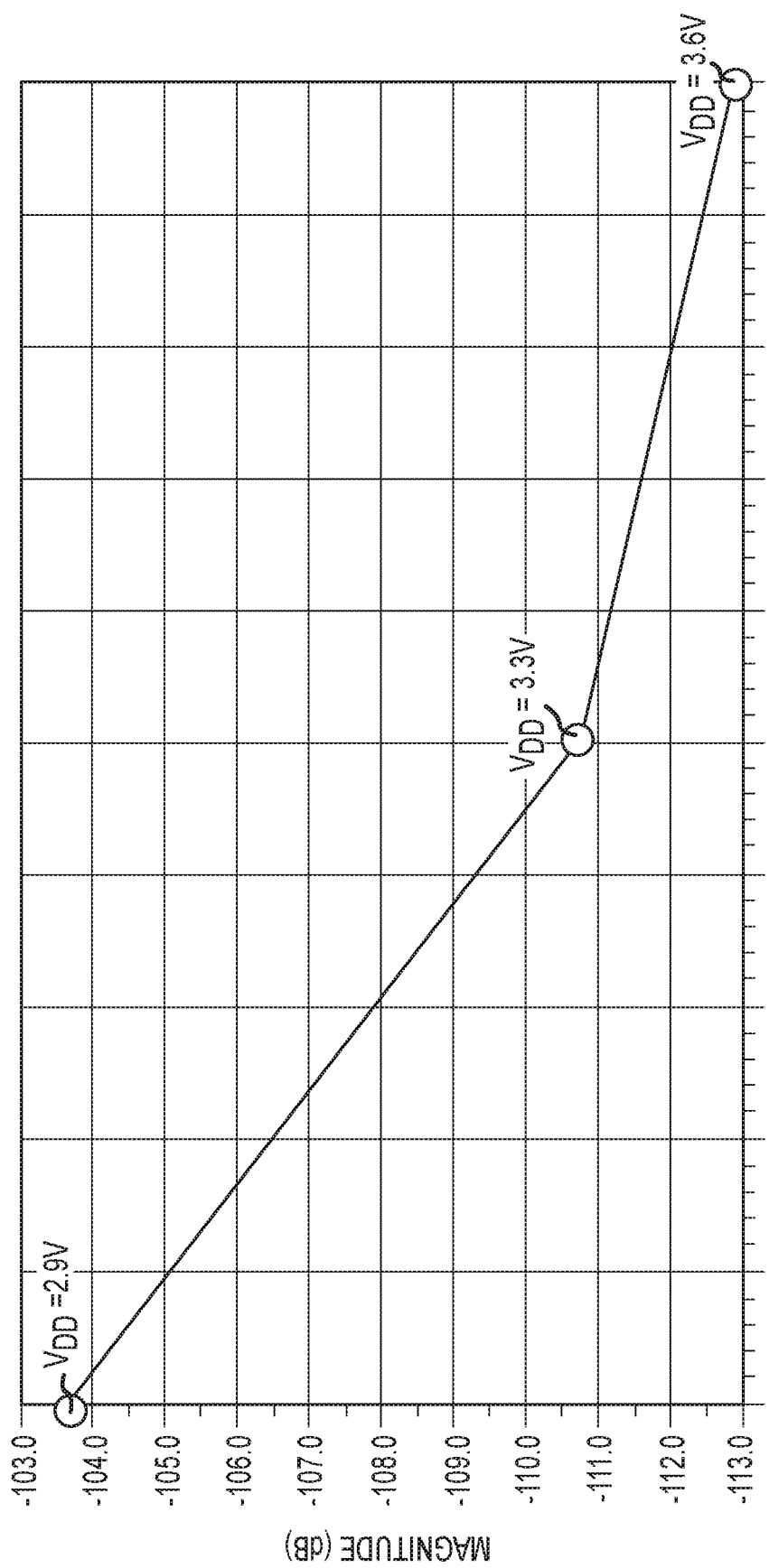
Figure 13:
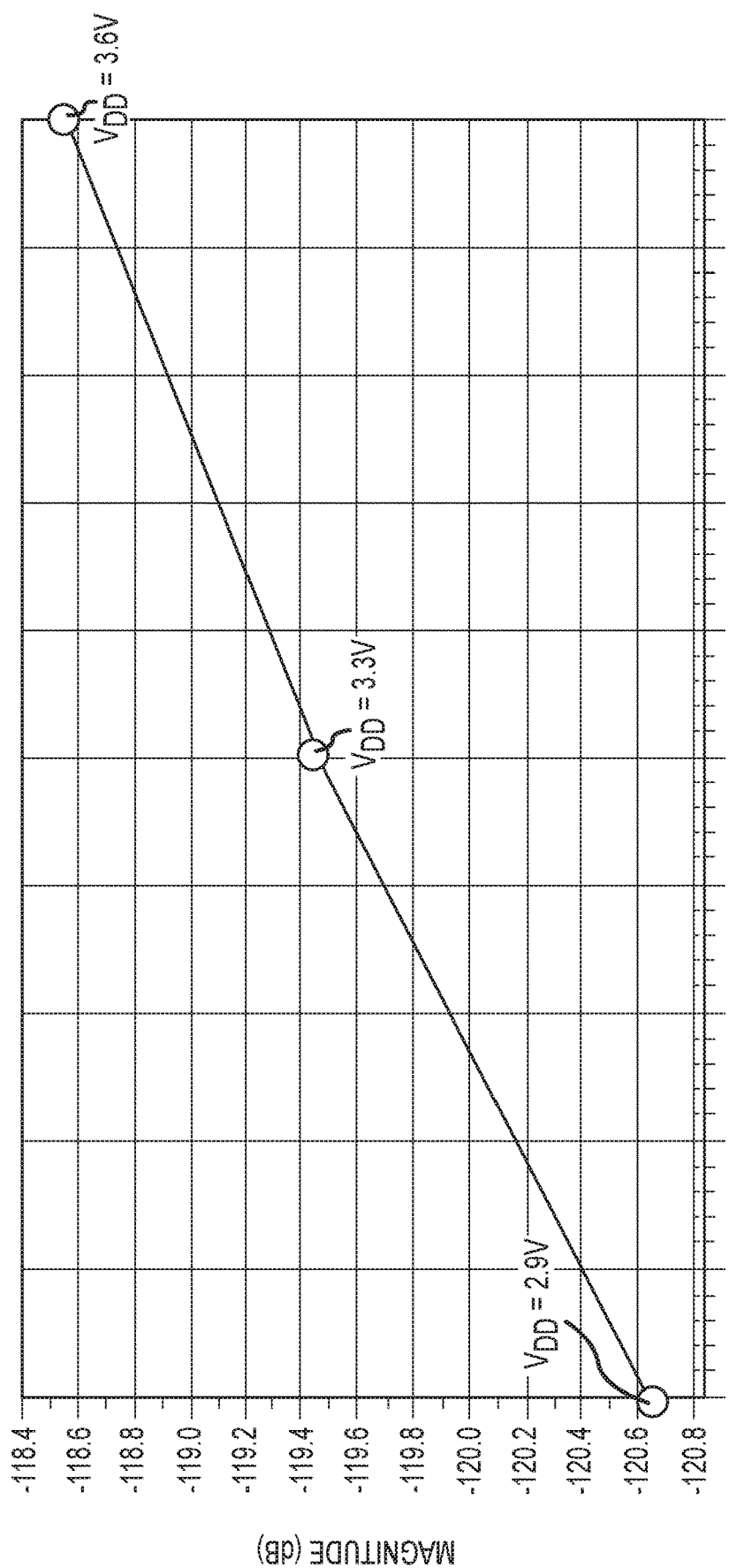
Figure 14:
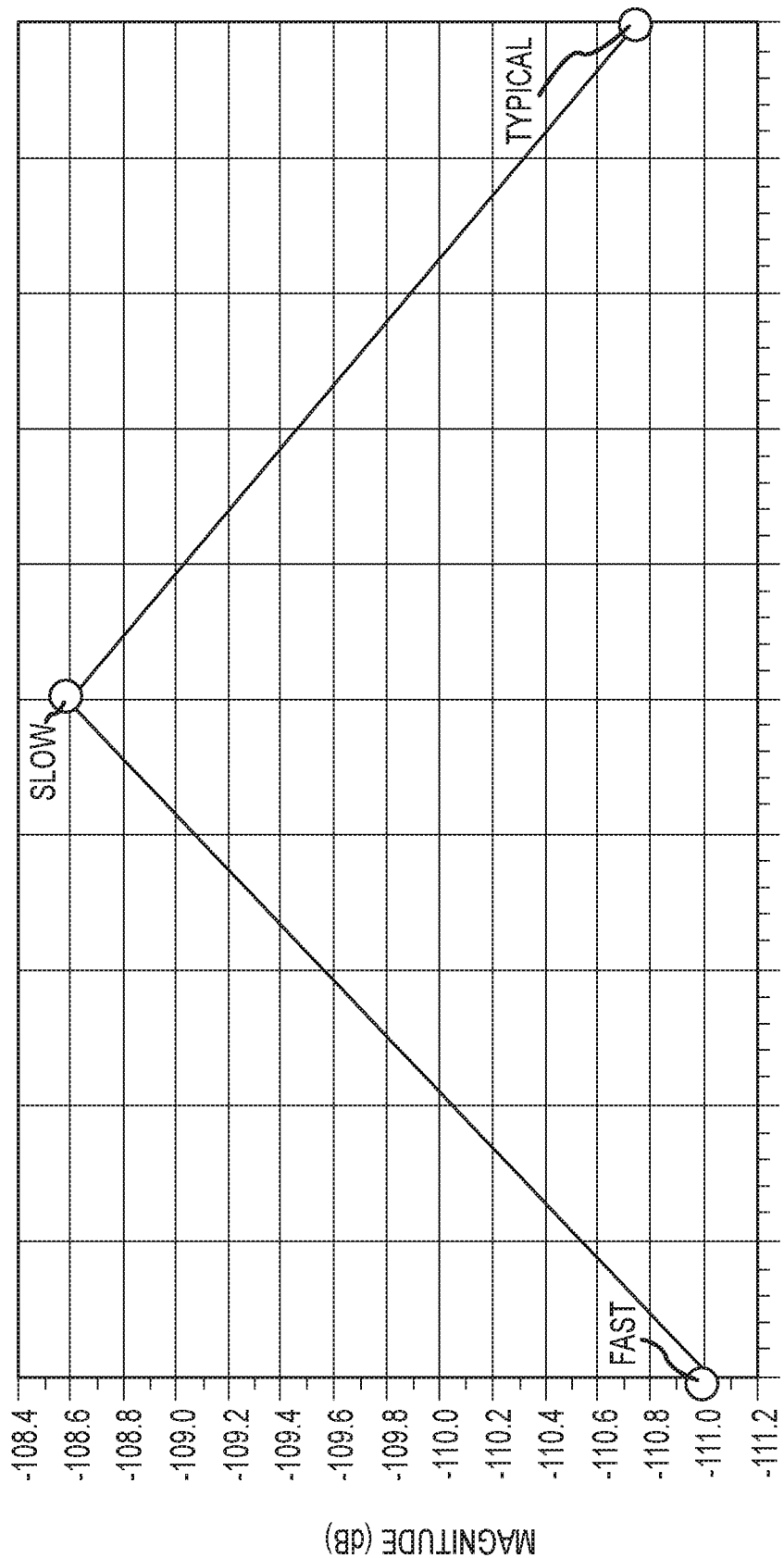
Figure 15:
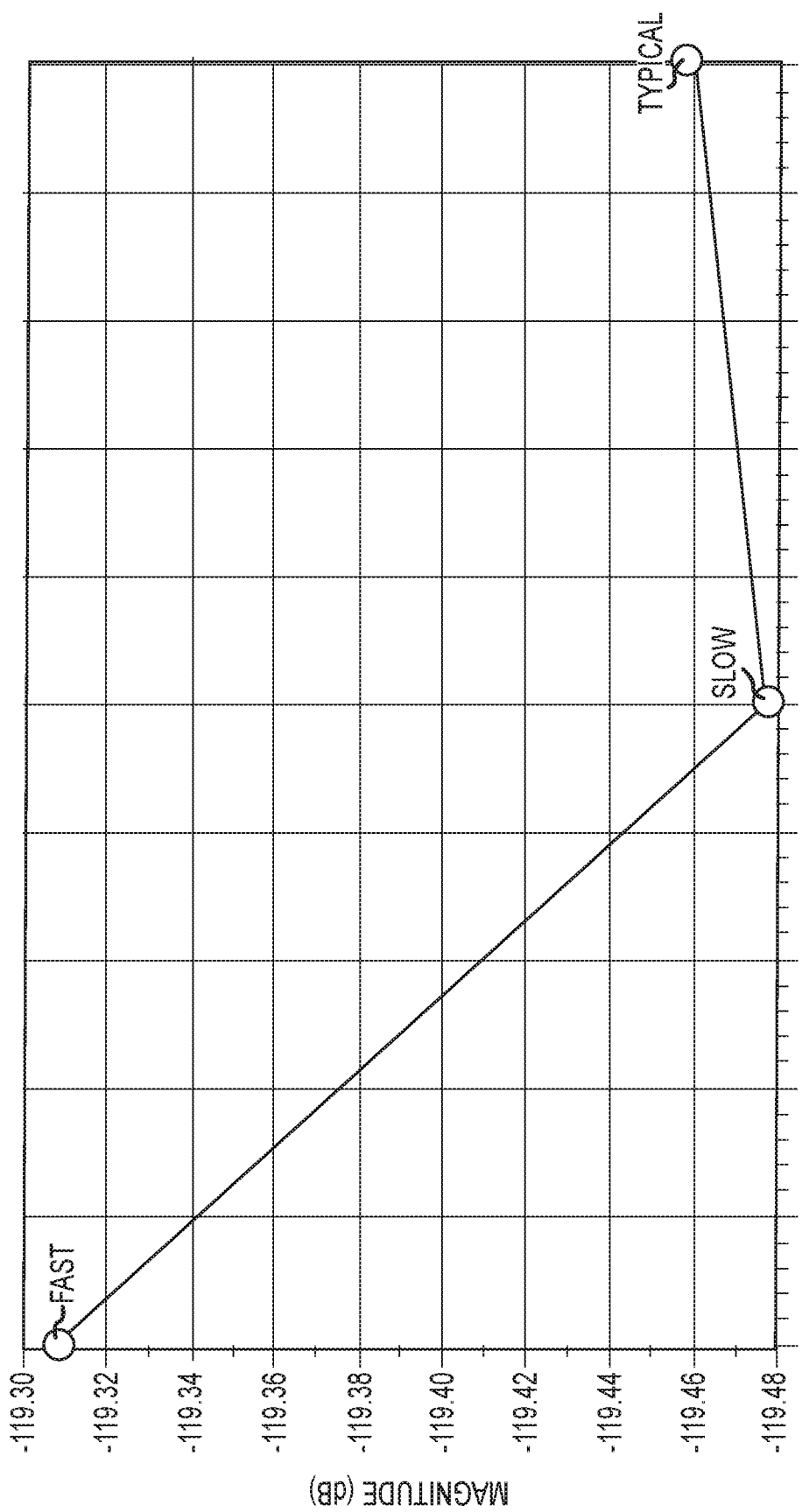
Figure 16:
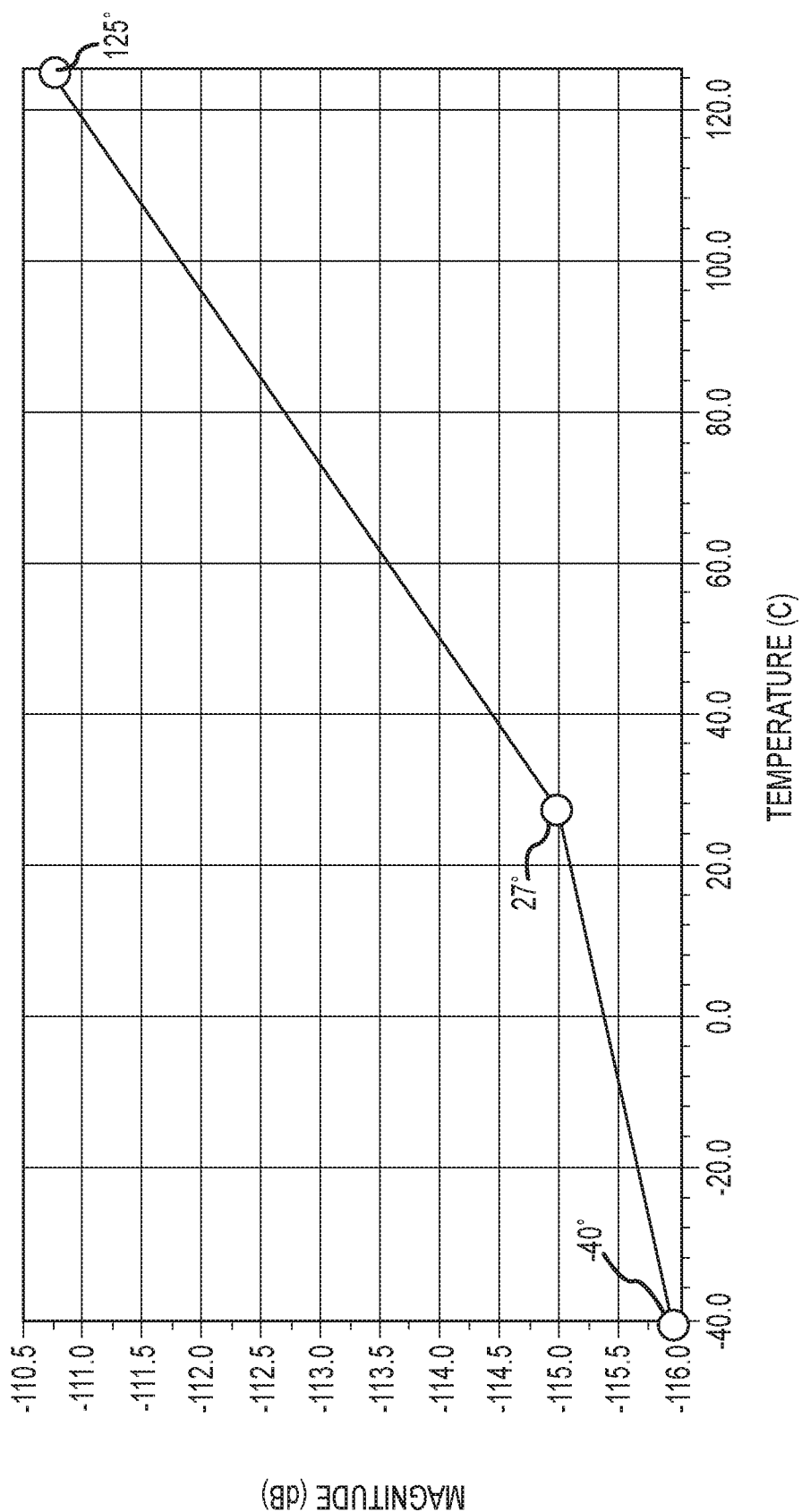
Figure 17:
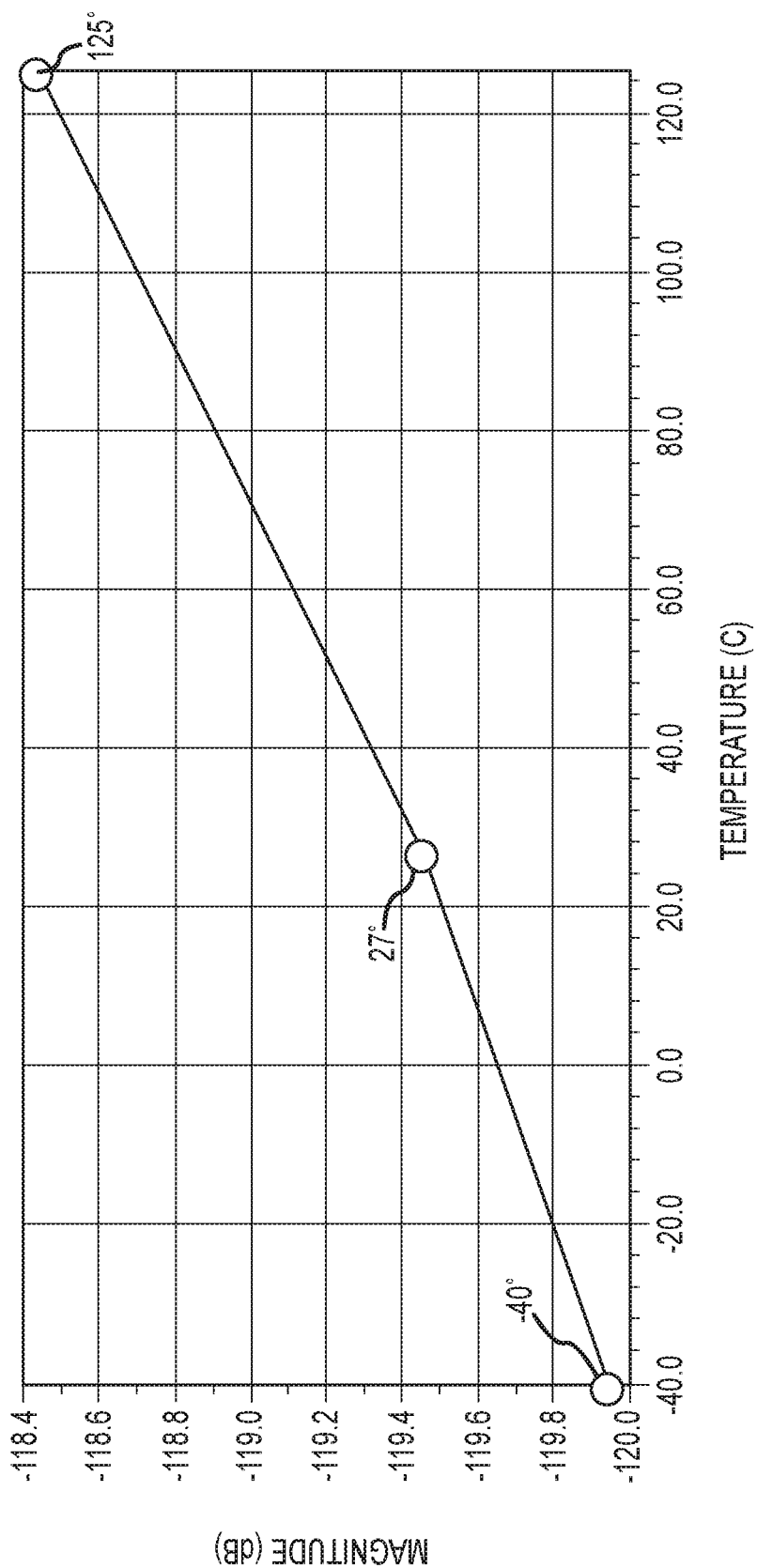
Figure 18:
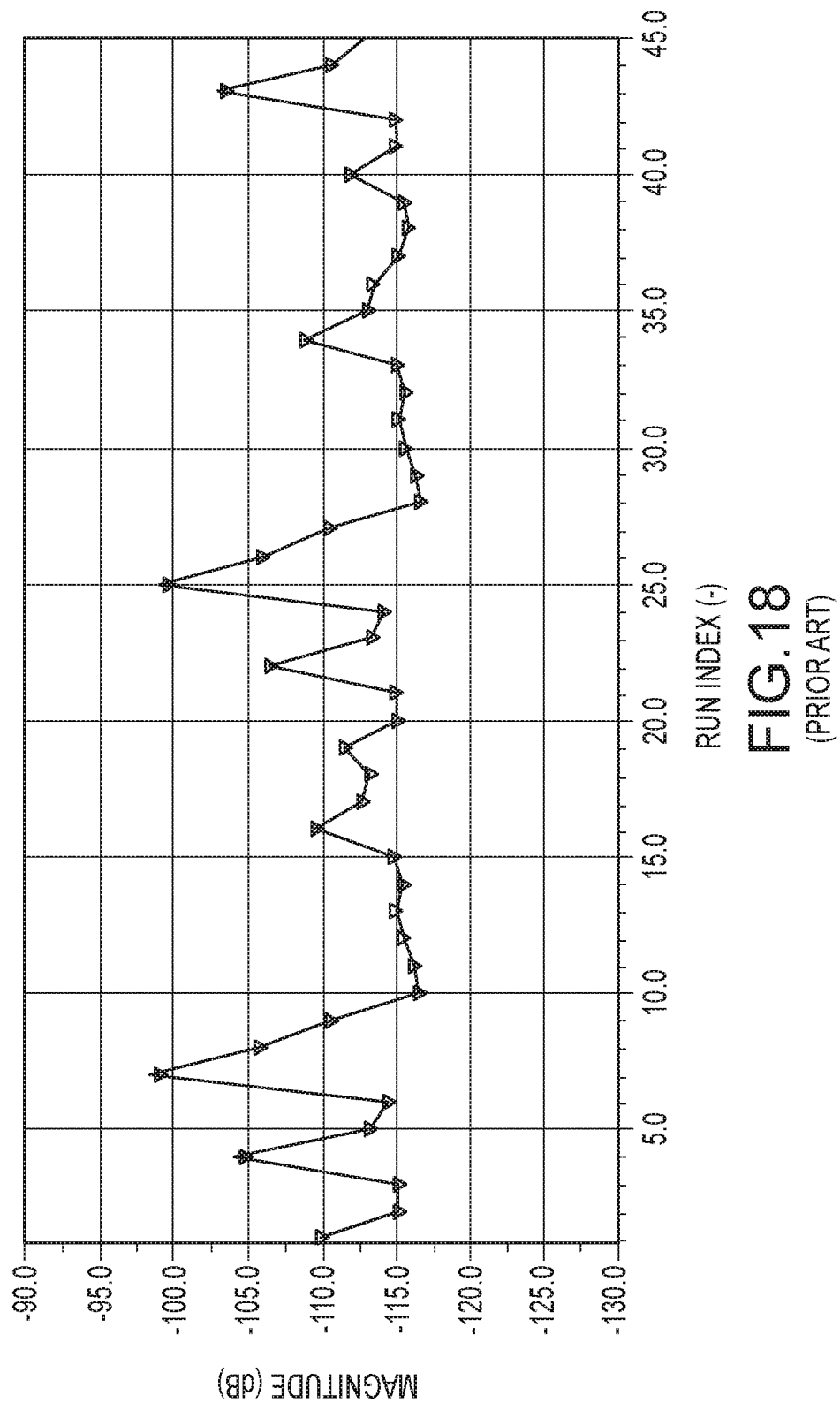
Figure 19:
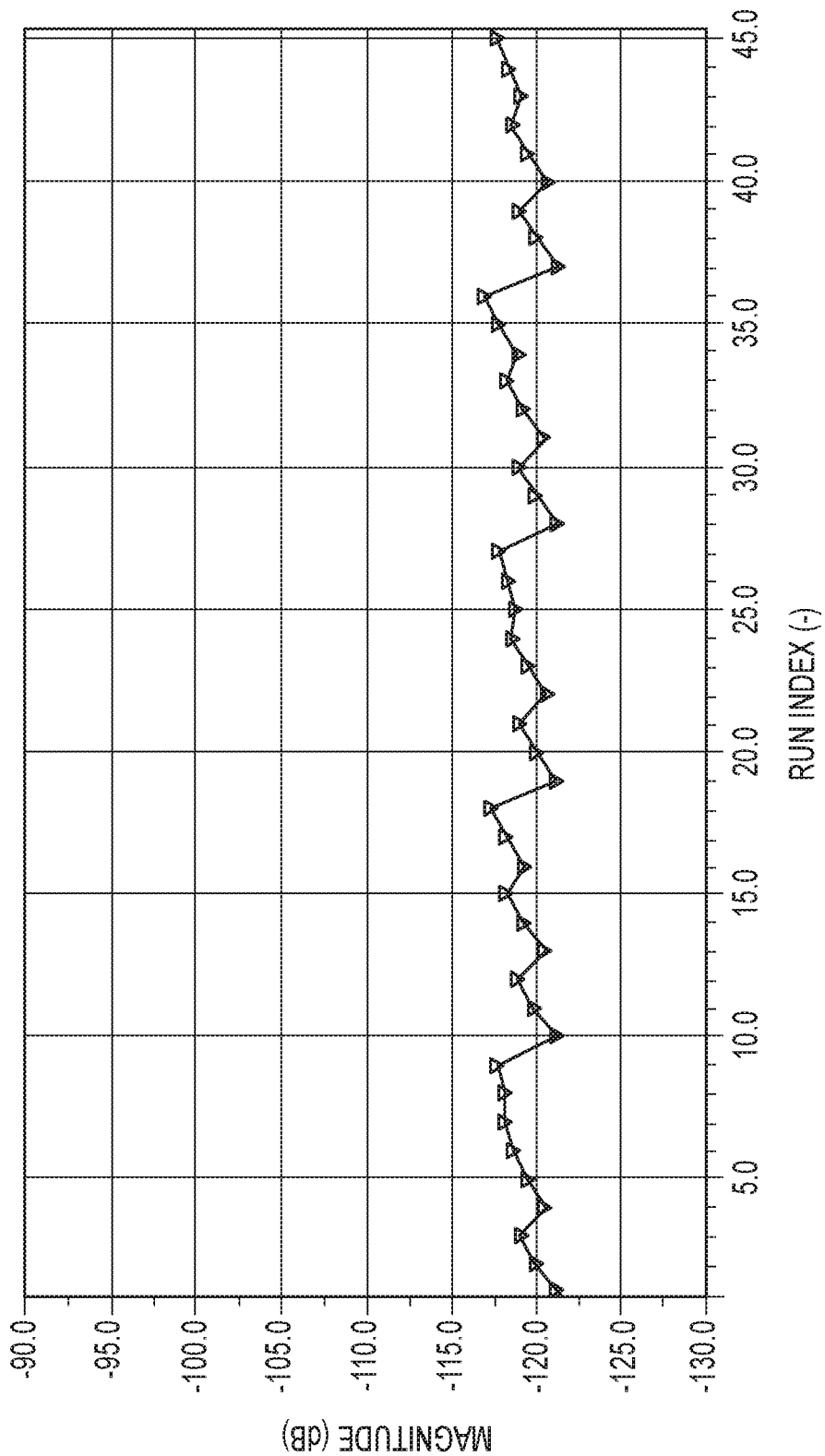
Figure 20:
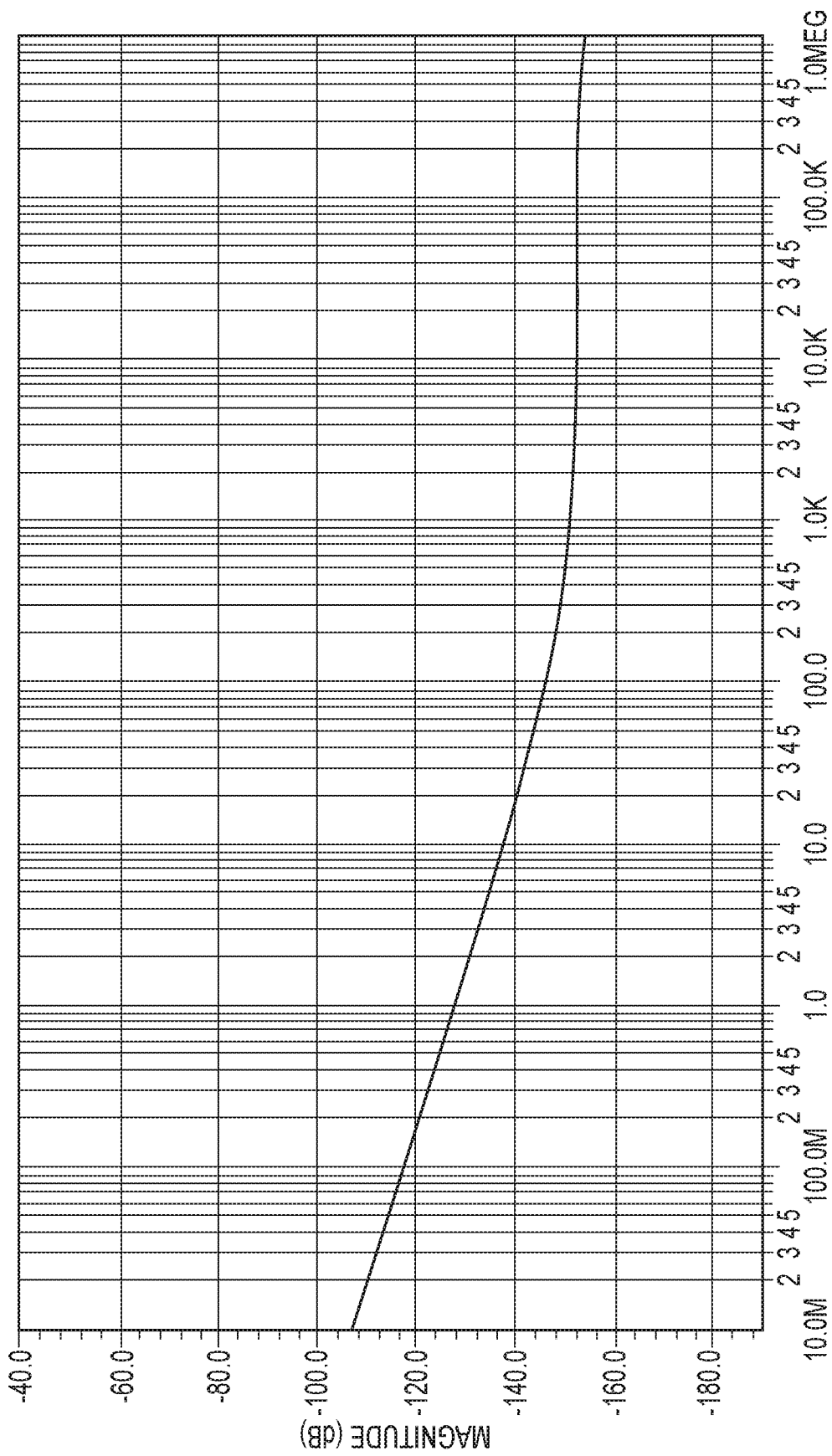
Figure 21:
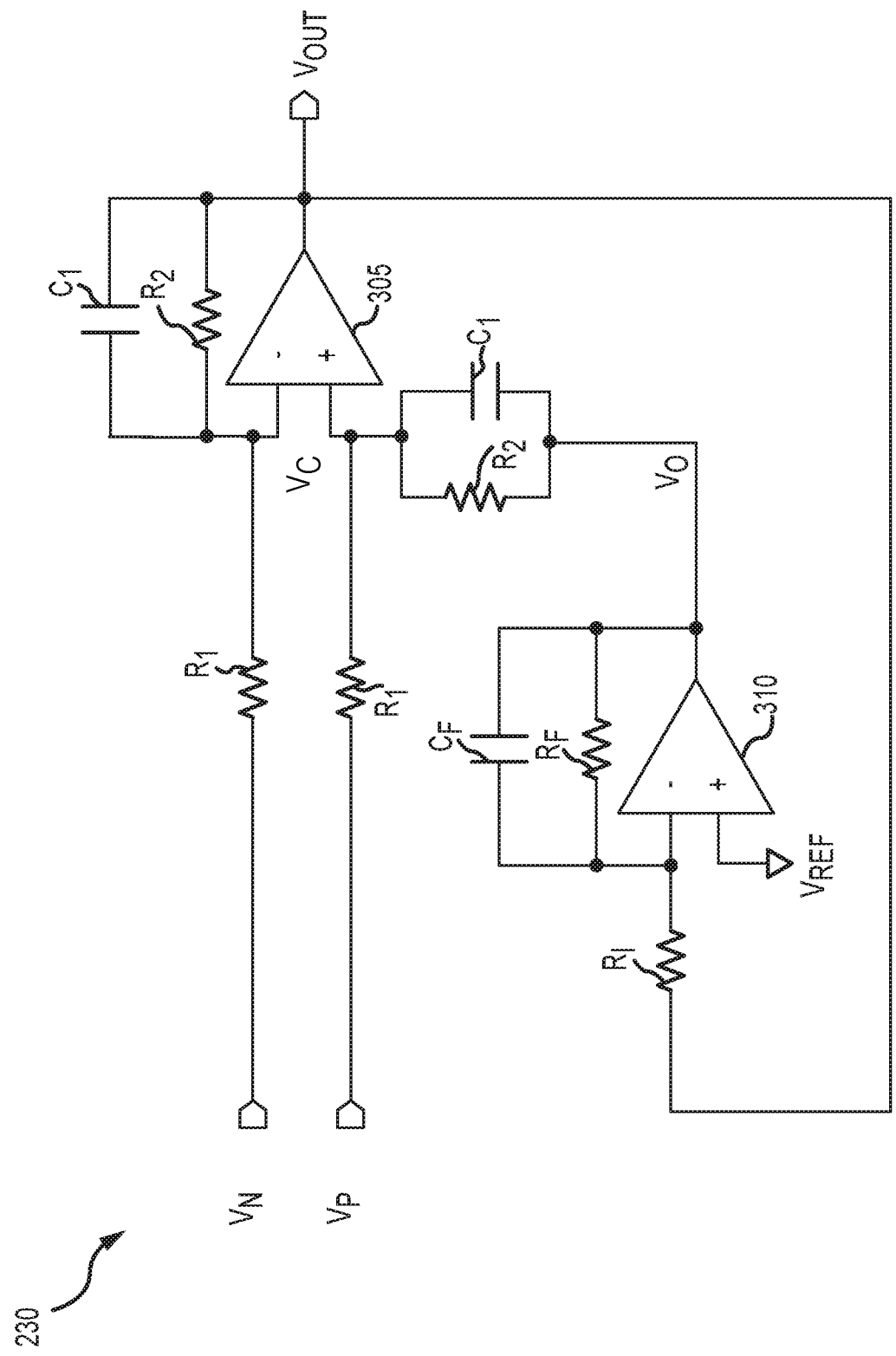

FIG. 5 a third circuit schematic of an output buffer in accordance with the present technology;

FIG. 6 is a fourth circuit schematic of an output buffer in accordance with the present technology;

FIG. 7 is a graph illustrating various voltage waveforms at various nodes in a conventional low-pass filter;

FIG. 8 is a graph illustrating various voltages waveforms at various nodes in a low-pass filter in accordance with the present technology;

FIG. 9 is a graph illustrating a fast Fourier transform spectrum of a conventional low-pass filter operating in a first condition;

FIG. 10 is a graph illustrating a fast Fourier transform spectrum of a conventional low-pass filter operating in a second condition;

FIG. 11 is a graph illustrating a fast Fourier transform spectrum of a low-pass filter in accordance with the present technology;

FIG. 12 is a graph illustrating total harmonic distortion characteristics of a conventional low-pass filter at various supply voltages;

FIG. 13 is a graph illustrating total harmonic distortion characteristics of a low-pass filter at various supply voltages according to the present technology;

FIG. 14 is a graph illustrating total harmonic distortion characteristics of a conventional low-pass filter at various process speeds;

FIG. 15 is a graph illustrating total harmonic distortion characteristics of a low-pass filter at various process speeds according to the present technology;

FIG. 16 is a graph illustrating total harmonic distortion characteristics of a conventional low-pass filter at various temperatures;

FIG. 17 is a graph illustrating total harmonic distortion characteristics of a low-pass filter at various temperatures according to the present technology;

FIG. 18 is a graph illustrating total harmonic distortion characteristics of a conventional low-pass filter with varying temperature, supply voltage, and process speeds;

FIG. 19 is a graph illustrating total harmonic distortion characteristics of a low-pass filter with varying temperature, supply voltage, and process speeds according to the present technology;

FIG. 20 is a graph illustrating a noise characteristic of a low-pass filter in accordance with an embodiment of the present technology; and FIG. 21 is a simplified circuit diagram of an output buffer for deriving a transfer function in accordance with various embodiments of the present technology.

DETAILED DESCRIPTION OF EXEMPLARY EMBODIMENTS

The present technology may be described in terms of functional block components and various processing steps. Such functional blocks may be realized by any number of components configured to perform the specified functions and achieve the various results. For example, the present technology may employ various filters, amplifiers, signal converters, signal processors, and semiconductor devices, such as transistors, capacitors, and the like, which may carry out a variety of functions. In addition, the present technology may be practiced in conjunction with any number of electronic systems, such as automotive, aviation, "smart devices," portables, and consumer electronics, and the systems described are merely exemplary applications for the technology. Further, the present technology may employ any number of conventional techniques for pulse generation, clock signal generation, voltage regulation, and the like.

Methods and apparatus for an amplifier circuit according to various aspects of the present technology may operate in conjunction with any suitable electronic system, such as an audio system, a microphone system, a video telephone, an acoustics system, hearing devices, and the like.

Figure 1:
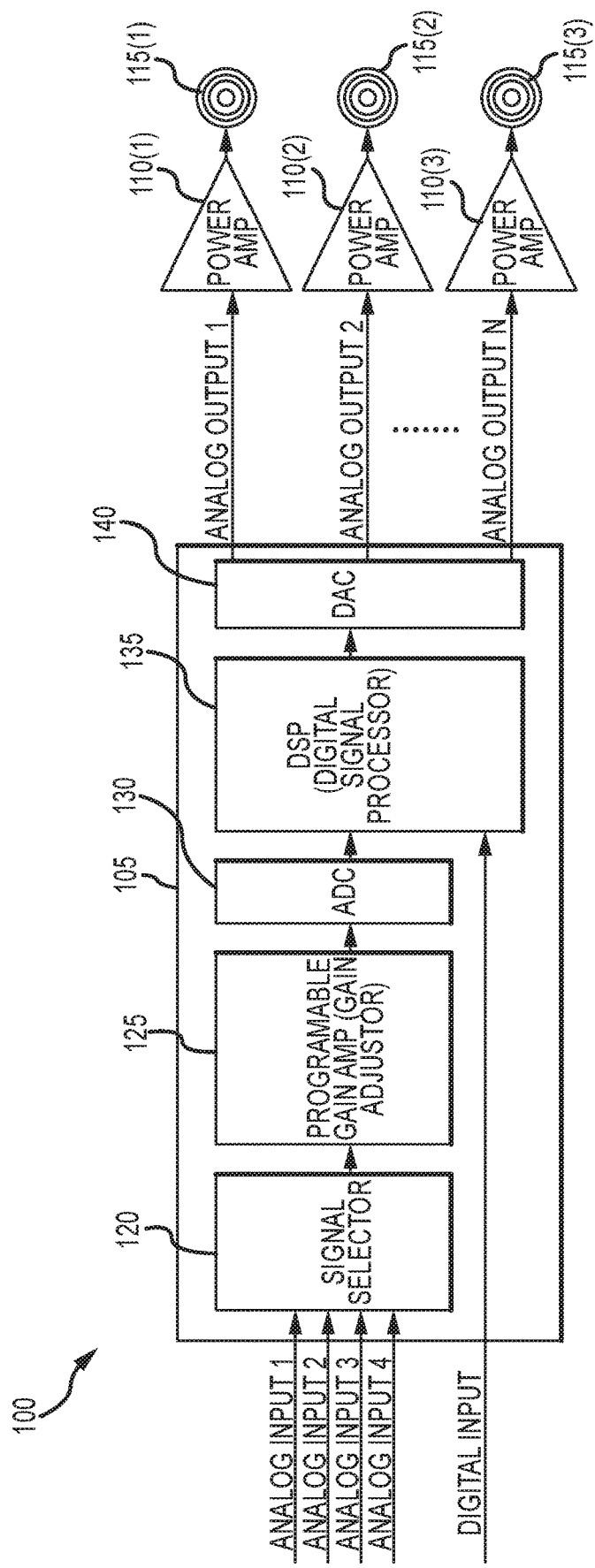
FIG. 1 is a block diagram of a system in accordance with an exemplary embodiment of the present technology.

Referring to FIG. 1, an electronic device and/or system according to various aspects of the present technology may comprise an audio system 100 configured to detect and process sound. For example, the audio system 100 may receive one or more analog input signals and/or digital signals, generate one or more analog output signals, and convert the analog output signals to sound. According to an exemplary embodiment, the audio system 100 may comprise an integrated circuit (IC) 105, a power amplifier 110, and a speaker 115.

The IC 105 may process the one or more input analog and/or digital signals. For example, the IC 105 may comprise a signal selector 120 to select one of various analog input signals, a gain adjustor circuit 125, such as a programmable gain amplifier, to adjust a gain of the selected analog input signal, an analog-to-digital converter (ADC) 130 to convert the selected analog input signal into a digital signal, a digital signal processor (DSP) 135 to process digital signals, and a digital-to-analog converter (DAC) 140 to convert the digital signal from the DSP 135 into the analog output signal. The IC 105 may transmit the analog output signal to the power amplifier 110, wherein the power amplifier 110 amplifies the analog output signal. The power amplifier 110 may then transmit the analog output signal to the speaker 115, wherein the speaker 115 converts the analog signal into a sound wave.

Figure 2:
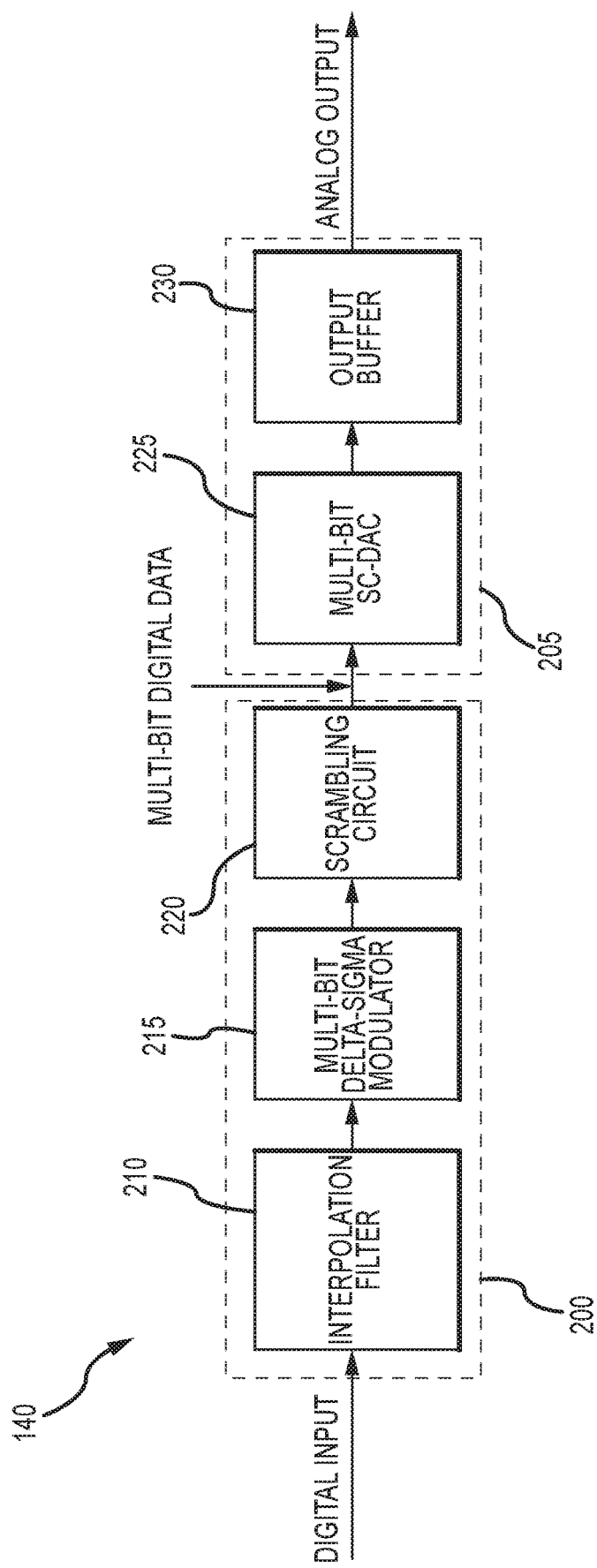
FIG. 2 is a block diagram of a digital-to-analog converter in accordance with an exemplary embodiment of the present technology.

Referring to FIG. 2, the DAC 140 may comprise a digital circuit 200 to perform digital processing on a multi-bit digital input and an analog circuit 205 to perform analog processing. In general, a DAC may be described according to various characteristics, such a signal-to-noise ratio (SNR), dynamic range, and a total harmonic distortion (THD). The SNR may be described as follows:

$$SNR[dB] = 20 \times \log\left(\frac{\text{signal}}{\text{noise}}\right). \quad \text{(Equation 1)}$$

The dynamic range may be described as follows:

$$DR[dB] = |THD+N| + 60 \quad \text{(Equation 2)},$$

where THD+N is the total harmonic distortion with noise at −60 dBFS input signal. The THD with noise may be described as follows:

$$THD + N[dB] = \quad \text{(Equation 3)}$$
$$20 \times \log\left(\frac{\sqrt{HD_3^2 + HD_2^3 + HD_4^2 + \ldots + HD_n^2 + \text{noise}^2}}{\text{signal}}\right),$$

where HD is a harmonic distortion component.

The digital circuit 200 may comprise an interpolation filter 210, a modulator circuit 215, such as a multi-bit delta-sigma modulator, and a scrambling circuit 220 that operate together to perform noise shaping and sampling functions. The interpolation filter 210, the modulator circuit 215 and the scrambling circuit 220 operate together to generate multi-bit digital data.

The analog circuit 205 may comprise a multi-bit switched-capacitor DAC circuit 225 and an output buffer 230 that operate together to convert a digital signal to an analog signal. In addition, the multi-bit switched capacitor DAC circuit 225 and the output buffer 230 may further operate to adjust a gain of the digital data and/or remove high frequency components from the analog signal. In general, the analog circuit 205 has the greatest impact on the overall THD and SNR characteristics of the DAC 140.

Referring to FIGS. 3-6, according to various embodiments, the output buffer 230(A-D) may comprise various resistors, capacitors, and operational amplifiers that operate together to provide gain adjustment and/or remove high frequency components of a first input signal $V_{IN\_N}$ and a second input signal $V_{IN\_P}$, where the first and second input signals $V_{IN\_N}$, $V_{IN\_P}$ are fully differential signals. The output buffer 230(A-D) may be formed as an integrated circuit with a single-ended output (e.g., $V_{OUT}$).

Figure 3:
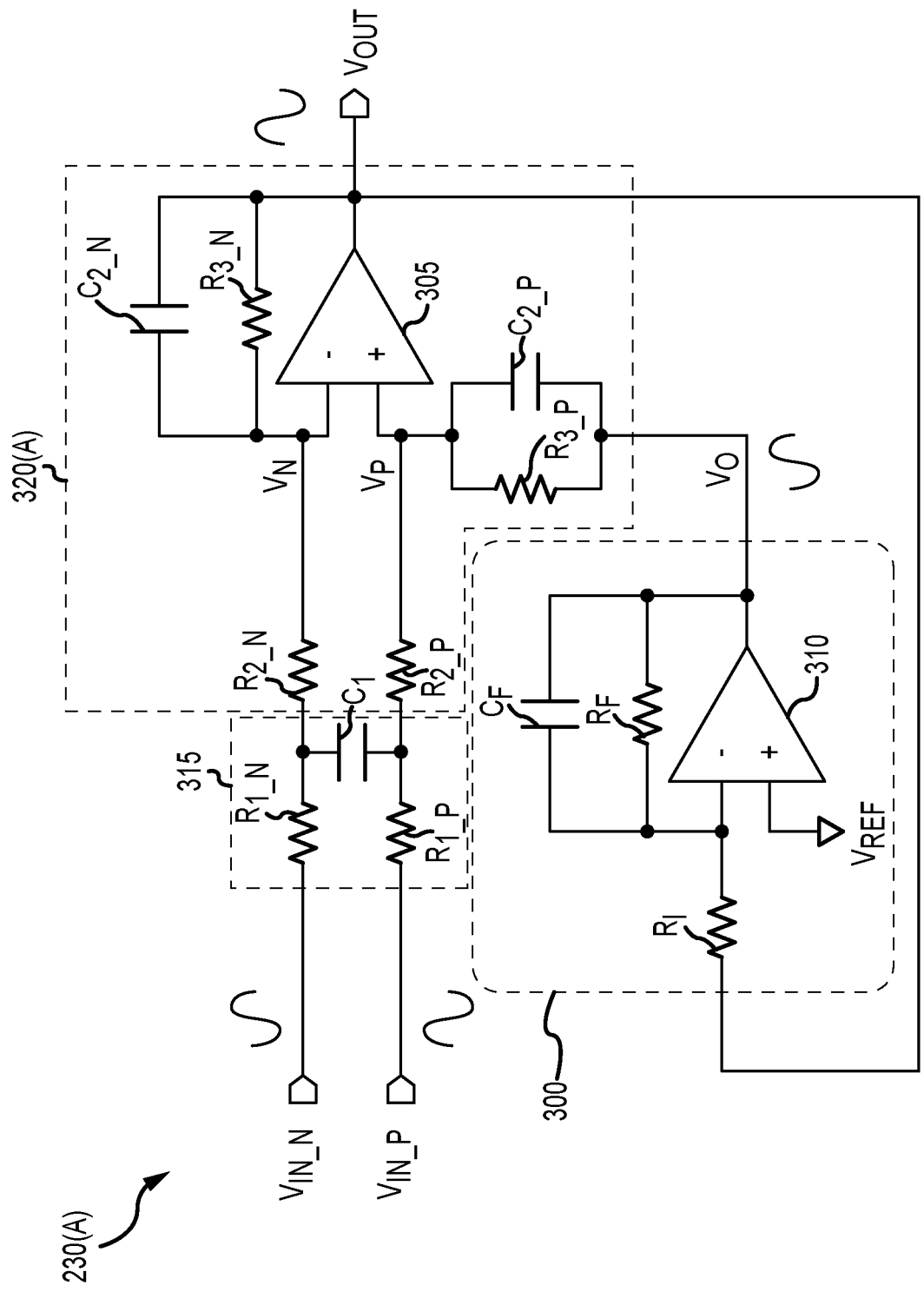
FIG. 3 is a first circuit schematic of an output buffer in accordance with the present technology.

In a first embodiment, and referring to FIG. 3, the output buffer 230(A) is configured as a second-order low-pass filter comprising a passive type, first-order low-pass filter 315 connected to an active type, first-order low-pass filter 320 (A).

Figure 4:
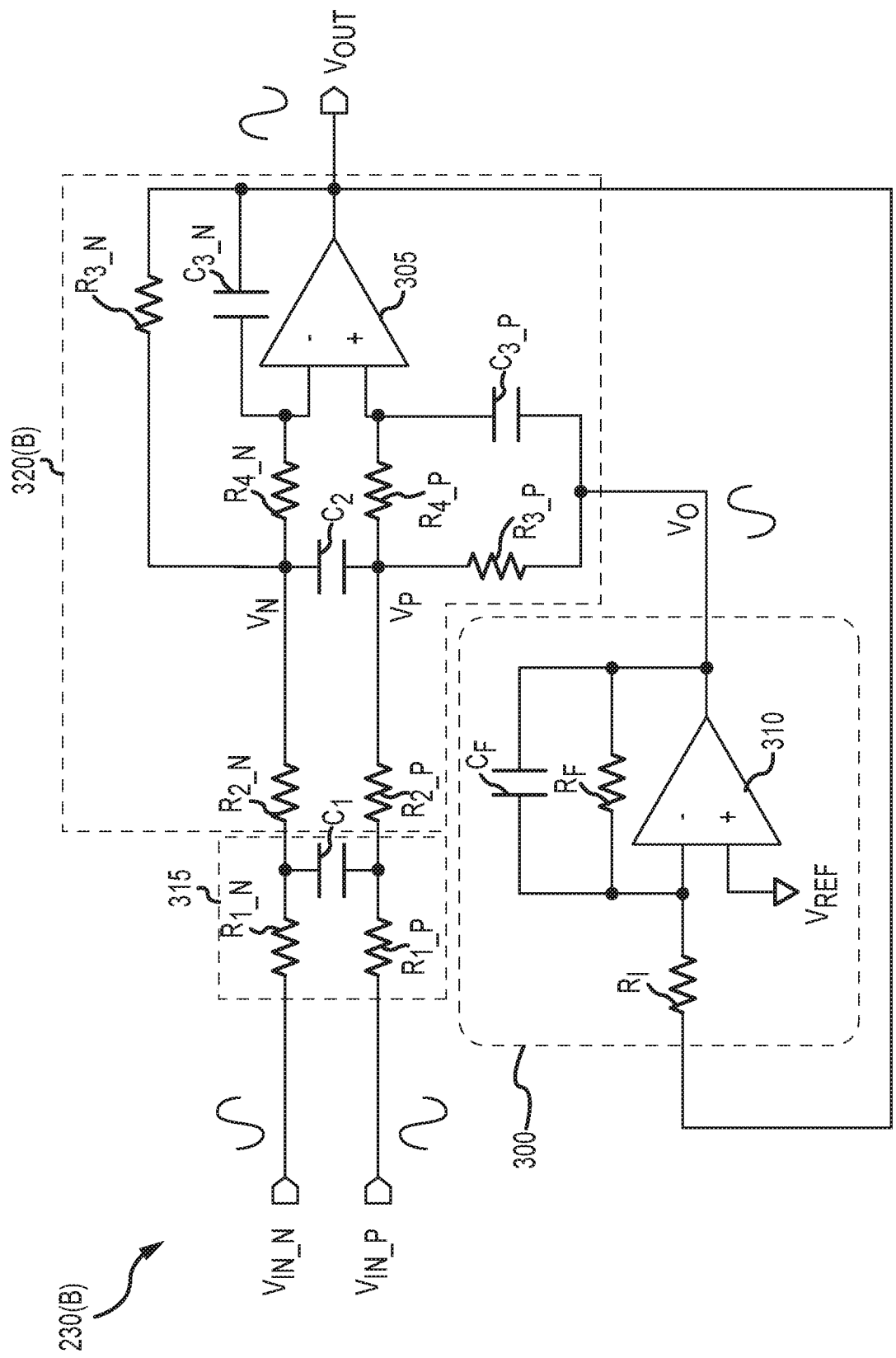
FIG. 4 is a second circuit schematic of an output buffer in accordance with the present technology.

In a second embodiment, and referring to FIG. 4, the output buffer 230(B) is configured as a multi-feedback type, second-order low-pass filter comprising the passive type first-order low-pass filter 315 connected to an alternative active type, first-order low-pass filter 320(B).

In a third embodiment, and referring to FIG. 5, the output buffer 230(C) comprises an alternative active type, first-order low-pass filter 320(C).

In a fourth embodiment, and referring to FIG. 6, the output buffer 230(D) is configured as a non-inverting amplifier that functions to only adjust the gain of the input signal.

According to various embodiments, the passive type, first-order low-pass filter 315 may comprise various resistors, such as resistors $R_{1\_N}$ and $R_{1\_P}$, and a capacitor $C_1$ arranged to remove undesired frequency components from the first and second input signals $V_{IN\_N}$, $V_{IN\_P}$.

According to various embodiments, the active type, first-order low-pass filter 320 may comprise various resistors, such as resistors $R_{2\_N}$, $R_{2\_P}$, $R_{3\_N}$, $R_{3\_P}$, $R_{4\_N}$, $R_{4\_P}$, and capacitors, such as capacitors $C_2$, $C_{2\_N}$, $C_{2\_P}$, $C_{3\_N}$, $C_{3\_P}$, to remove undesired frequency components. According to an exemplary embodiment, and referring to FIG. 5, the resistance value of resistor $R_{1\_N}$ is equal to the resistance value of resistor $R_{1\_P}$; the resistance value of resistor $R_{2\_N}$ is equal to the resistance value of resistor $R_{2\_P}$; the capacitance of capacitor $C_{1\_N}$ is equal to the capacitance of capacitor $C_{2\_P}$; and the resistance value of resistor $R_F$ is equal to the resistance value of resistor $R_I$. The particular values of the resistors and capacitors may be selected according to the particular application, desired frequency attenuation, and the like.

According to various embodiments, the output buffer 230(A-D) comprises a first operational amplifier (op-amp) 305 connected to a feedback circuit to provide gain adjustment. The first op-amp 305 comprises an inverting terminal (−) to receive a first signal $V_P$ (i.e., a first voltage), a non-inverting terminal (+) to receive a second signal $V_N$ (i.e., a second voltage), and an output terminal to transmit an output signal $V_{OUT}$.

According to various embodiments, a resistor and/or a capacitor may be connected between the output terminal of the first op-amp 305 and at least the inverting terminal (−) of the first op-amp 305, for example, $R_{3\_N}$ and $C_{2\_N}$ of FIG. 3, $R_{3\_N}$ and $C_{3\_N}$ of FIG. 4, $R_{2\_N}$ and $C_{1\_N}$ of FIG. 5, and $R_{2\_N}$ of FIG. 6. According to various embodiments the resistor and the capacitor may be connected in parallel (e.g., as illustrated in FIGS. 3 and 5).

The feedback circuit connects the output terminal of the first op-amp 305 to the non-inverting terminal (+) of the first op-amp. Accordingly, the output signal $V_{OUT}$ changes according to a feedback signal $V_O$ generated by the feedback circuit. According to various embodiments, the feedback circuit comprises an inverting amplifier circuit 300.

According to various embodiments, the inverting amplifier circuit 300 may be connected to the first op-amp 305 via a resistor and/or a capacitor, for example $R_{3\_P}$ and $C_{2\_P}$ of FIG. 3, $R_{3\_P}$ and $C_{3\_P}$ of FIG. 4, $R_{2\_P}$ and $C_{1\_P}$ of FIG. 5, and $R_{2\_P}$ of FIG. 6. According to various embodiments the resistor and the capacitor may be connected in parallel (e.g., as illustrated in FIGS. 3 and 5). According to various embodiments, the resistor and the capacitor may connect the inverting amplifier circuit 300 to at least the non-inverting terminal (+) of the first op-amp 305.

The inverting amplifier circuit 300 may comprise a second op-amp 310. The second op-amp 310 comprises an inverting terminal (−) to receive the output signal $V_{OUT}$ from the first op-amp 305, a non-inverting terminal (+) to receive a reference voltage $V_{REF}$, and an output terminal to transmit the feedback signal $V_O$ to the non-inverting terminal (+) of the first op-amp 305.

The inverting amplifier circuit 300 may further comprise a feedback resistor $R_F$ and a feedback capacitor $C_F$ connected between the output terminal and the inverting terminal (−) of the second op-amp 310. The feedback resistor $R_F$ and the feedback capacitor $C_F$ may be connected in parallel. In various embodiments, the feedback resistor $R_F$ has a fixed resistance value, however, in alternative embodiments, the feedback resistor may have a variable resistance.

The inverting amplifier circuit 300 may further comprise an input resistor $R_I$ connected between the output terminal of the first op-amp 305 and the inverting terminal (−) of the second op-amp 310. The input resistor $R_I$ may have any suitable resistance value and the resistance value may be selected according to the particular application, desired gain, and the like.

In various embodiments, an amplitude A of the feedback signal $V_O$ may vary according to a resistance ratio, wherein the resistance ratio is the resistance value of the feedback resistor $R_F$ divided by the resistance value of the input resistor $R_I$ (i.e., $A=R_F/R_I$). Accordingly, a gain of the second op-amp 310 may be adjusted without changing the frequency response of the output buffer 230 by varying the resistance value of the feedback resistor $R_F$. In various embodiments, however, the resistance values of the feedback resistor $R_F$ and the input resistor $R_I$ may be fixed, and therefore, the amplitude A is also fixed.

According to various embodiments, the output buffer 230 may be described according to a transfer function TF(s), which can be derived using a simplified circuit diagram (FIG. 21) and Kirchhoff's Current Law as follows:

$$\frac{V_P - V_C}{R_1} = \frac{V_P - A \times V_{OUT}}{R_2} + s \times C_1 \times (V_c + A \times V_{OUT}), \quad \text{(Equation 4)}$$

$$\frac{V_N - V_C}{R_1} = \frac{V_C - V_{OUT}}{R_2} + s \times C_1 \times (V_C - V_{OUT}), \quad \text{(Equation 5)}$$

where s is a Laplace operator and $V_C$ is a common voltage, since the first voltage $V_N$ becomes equal to the second voltage $V_P$.

In addition, a relationship between $V_P$, $V_N$, and $V_{OUT}$ is described as follow:

$$R_2 \times (V_P - V_N) = R_1 \times (1+A) \times (1 + R_2 \times C_1 \times s) \times V_{OUT} \quad \text{(Equation 6)}$$

Therefore, the transfer function TF(s) of the output buffer 230 is given by the following:

$$TF(s) = \frac{V_{OUT}}{V_P - V_N} = \frac{R_2}{R_1 \times (1+A)} \times \frac{1}{R_2 \times C_1 \times s + 1}, \quad \text{(Equation 7)}$$

and the gain is described as follows:

$$\text{Gain} = \frac{R_2}{R_1 \times (1+A)}. \quad \text{(Equation 8)}$$

According to various embodiments, the first and second op-amps 305, 310 may comprise a plurality of transistors (not shown) arranged in any suitable typology. Each transistor is described according to a flicker noise $V_{nf}$ and a thermal noise $V_{nth}$. The flicker noise $V_{nf}$ of each transistor is given by:

$$V_{nf}^2 = \frac{K}{C_{ox} \times W \times L} \times \frac{1}{f}, \quad \text{(Equation 9)}$$

where K is a constant dependent on the manufacturing processes, $C_{ox}$ is a gate oxide film capacitance per unit area, W is a gate width, L is a gate length, and f is a frequency.

The thermal noise $V_{nth}$ of each transistor is given by:

$$V_{nth}^2 = \frac{8}{3} \times \frac{k \times T}{g_m}, \quad \text{(Equation 10)}$$

where k is a Boltzmann's constant, T is a temperature in Kelvin, and $g_m$ is a transconductance of a transistor, and the transconductance $g_m$ is given by:

$$g_m = \sqrt{2 \times \mu \times C_{ox} \times \left(\frac{W}{L}\right) \times I_d}, \quad \text{(Equation 11)}$$

where μ is mobility of the transistor, $C_{ox}$ is a gate oxide film capacitance per unit area, W is a gate width, L is a gate length, and $I_d$ is a drain current of the transistor.

According to various embodiments of the present technology, the DAC 140 may exhibit a stable signal-to-noise ratio characteristic and a stable total harmonic distortion characteristic in the event of supply voltage changes, temperature changes, and process variations. Accordingly, the output signal $V_{OUT}$ may include little to no distortion.

In operation, and referring to FIGS. 8, 11, 13, 15, 17, and 19-20, the first and second signals $V_N$, $V_P$ to the first op-amp 305 are substantially constant over time when the full-differential input analog signals $V_{IN\_N}$, $V_{IN\_P}$ are transmitted to the first op-amp 305 from the multi-bit switched-capacitor DAC circuit 225 (FIG. 8). Because the first and second signals $V_N$, $V_P$ supplied to the first op-amp 305 are fixed around a reference voltage, the characteristic variation caused by the first op-amp 305 is minimized. Therefore, the DAC 140 exhibits a stable total harmonic distortion characteristic. In contrast, in a conventional DAC, the first and second signals $V_N$, $V_P$ range from 1.2 V to 2.1 V. A total harmonic distortion characteristic of the conventional DAC deteriorates due this large voltage swing.

For example, and referring to FIGS. 9-11, THD characteristics manifest in the FFT spectrum as a plurality of harmonic components (e.g., $HD_2$, $HD_3$, $HD_4$ from Equation 3). In various embodiments of the present technology, and referring to FIG. 11, the DAC 140 has a low distortion characteristic when a magnitude of each harmonic component is small compared to the input signal. Also, the DAC 140 has a stable THD characteristic when the magnitude of each harmonic component remains relatively stable even in the event of supply voltage changes, temperature changes, and process variations.

In embodiments of the present technology, most of the harmonic components are lower than −140 dB. Even a maximum harmonic component (i.e., a third harmonic component) is approximately −120 dB. In contrast, most of the harmonic components in the conventional DAC are higher than −140 dB. In addition, the maximum harmonic component (third harmonic component) in the conventional DAC is higher than −120 dB (FIG. 9). In another case, some of the harmonic components in the conventional DAC are higher than −120 dB (FIG. 10). Furthermore, the second harmonic component in the conventional DAC varies greatly because the first and second signals $V_N$, $V_P$ to the first op-amp 305 have a large voltage swing. As a result, the THD characteristics of the conventional DAC significantly deteriorate with supply voltage changes, temperature changes, and process variations.

Referring to FIGS. 12-19, further evidence of the THD characteristics may be observed when the DAC undergoes changes in temperature, changes in supply voltage, and process variations, individually. According to embodiments of the present technology, the DAC 140 exhibits stable THD characteristics in the event of changes in temperature, changes in supply voltage, and process variations, as compared to a conventional DAC. For example, in a case of changes to the supply voltage, the FFT simulation results illustrate that the DAC 140 exhibits a THD characteristic change of less than 2 dB (FIG. 13), while the conventional DAC 140 exhibits a THD characteristic change of approximately 10 dB (FIG. 12) under the same conditions.

In a case of changes to the temperature, the FFT simulation results illustrate that the DAC 140 exhibits a THD characteristic change of less than 1.6 dB (FIG. 17), while the conventional DAC 140 exhibits a THD characteristic change of approximately 5.5 dB (FIG. 16) under the same conditions.

In a case of process variations (i.e., varying the threshold voltage of the transistor), the FFT simulation results illustrate that the DAC 140 exhibits a THD characteristic change of less than 0.2 dB (FIG. 15), while the conventional DAC 140 exhibits a THD characteristic change of approximately 2.4 dB (FIG. 14) under the same conditions.

A 'typical' process may be defined as a transistor having a 'normal' threshold voltage, 'normal' current, and 'normal' speed. A 'fast' process may be defined as a transistor with a threshold voltage that is lower than the normal threshold voltage, a larger current than the normal current, and a higher speed than the normal speed. A 'slow' process may be defined as a transistor with a threshold voltage that is higher than the normal threshold voltage, a smaller current than the normal current, and a lower speed than the normal speed.

Simulations that consider variations in all conditions (i.e., temperature, process, and supply voltage), demonstrate that the DAC 140 according to various embodiments of the present technology have a THD characteristic that is substantially stable. For example, the THD characteristic change of the DAC 140 is less than 5 dB (FIG. 19), while a THD characteristic change of the conventional DAC ranges from 15 dB to 18 dB under the same conditions. Accordingly, embodiments of the present technology provide a THD variation range that improves by more than 10 dB over the conventional DAC.

Further, embodiments of the present technology exhibit a noise characteristic that doesn't deteriorate, therefore a high SNR is maintained (FIG. 20).

In the foregoing description, the technology has been described with reference to specific exemplary embodiments. The particular implementations shown and described are illustrative of the technology and its best mode and are not intended to otherwise limit the scope of the present technology in any way. Indeed, for the sake of brevity, conventional manufacturing, connection, preparation, and other functional aspects of the method and system may not be described in detail. Furthermore, the connecting lines shown in the various figures are intended to represent exemplary functional relationships and/or steps between the various elements. Many alternative or additional functional relationships or physical connections may be present in a practical system.

The technology has been described with reference to specific exemplary embodiments. Various modifications and changes, however, may be made without departing from the scope of the present technology. The description and figures are to be regarded in an illustrative manner, rather than a restrictive one and all such modifications are intended to be included within the scope of the present technology. Accordingly, the scope of the technology should be determined by the generic embodiments described and their legal equivalents rather than by merely the specific examples described above. For example, the steps recited in any method or process embodiment may be executed in any order, unless otherwise expressly specified, and are not limited to the explicit order presented in the specific examples. Additionally, the components and/or elements recited in any apparatus embodiment may be assembled or otherwise operationally configured in a variety of permutations to produce substantially the same result as the present technology and are accordingly not limited to the specific configuration recited in the specific examples.

Benefits, other advantages and solutions to problems have been described above with regard to particular embodiments. Any benefit, advantage, solution to problems or any element that may cause any particular benefit, advantage or solution to occur or to become more pronounced, however, is not to be construed as a critical, required or essential feature or component.

The terms "comprises", "comprising", or any variation thereof, are intended to reference a non-exclusive inclusion, such that a process, method, article, composition or apparatus that comprises a list of elements does not include only those elements recited, but may also include other elements not expressly listed or inherent to such process, method, article, composition or apparatus. Other combinations and/or modifications of the above-described structures, arrangements, applications, proportions, elements, materials or components used in the practice of the present technology, in addition to those not specifically recited, may be varied or otherwise particularly adapted to specific environments, manufacturing specifications, design parameters or other operating requirements without departing from the general principles of the same.

The present technology has been described above with reference to an exemplary embodiment. However, changes and modifications may be made to the exemplary embodiment without departing from the scope of the present technology. These and other changes or modifications are intended to be included within the scope of the present technology, as expressed in the following claims.

The invention claimed is:

1. An integrated circuit, comprising:
   a first operational amplifier (op-amp) comprising:
      a non-inverting input terminal;
      an inverting input terminal; and
      an output terminal; and
   a inverting amplifier circuit connected to the first operational amplifier and comprising:
      a second operational amplifier (op-amp) comprising:
         an inverting input terminal connected to the output terminal of the first operational amplifier; and
         an output terminal connected to the non-inverting terminal of the first operational amplifier; and
      at least one of a first resistor and a first capacitor, wherein the at least one of the resistor and the capacitor is connected between the output terminal of the second operational amplifier and the inverting terminal of the second operational amplifier.

2. The integrated circuit according to claim 1, further comprising a second resistor and a second capacitor connected directly between the output terminal of the second op-amp and the non-inverting terminal of the first op-amp; wherein the second resistor and the second capacitor are connected in parallel with each other.

3. The integrated circuit according to claim 1, wherein the second op-amp further comprises a non-inverting input terminal connected to a reference voltage.

4. The integrated circuit according to claim 1, further comprising:
   a second resistor connected between the output terminal of the first op-amp and the inverting terminal of the first op-amp; and
   a second capacitor connected between the output terminal of the first op-amp and the inverting terminal of the first op-amp, wherein the second capacitor is connected in parallel with the second resistor.

5. The integrated circuit according to claim 1, further comprising a second resistor connected directly between the output terminal of the first op-amp and the inverting terminal of the second op-amp.

6. The integrated circuit according to claim 1, wherein a gain of the second op-amp is 1.

7. The integrated circuit according to claim 1, further comprising:
   a second resistor connected to the output terminal of the second op-amp; and
   a second capacitor connected to the output terminal of the second op-amp and the non-inverting terminal of the first op-amp;
   wherein the second resistor is further connected to:
      the inverting terminal of the first op-amp via a third capacitor and a third resistor; and
      the non-inverting terminal of the first op-amp via a fourth resistor.

8. The integrated circuit according to claim 1, wherein the integrated circuit is configured to:
   receive differential input signals; and
   generate a single-ended output.

9. A method for removing distortion in an output signal of a digital-to-analog converter (DAC), comprising:
   reducing an amplitude of a first input signal at an inverting terminal of a first operational amplifier (op-amp) comprising:
      generating a first feedback signal according to an output signal of the first op-amp; and
      transmitting the first feedback signal to the inverting terminal of the first op-amp; and
   reducing an amplitude of a second input signal at a non-inverting terminal of the first op-amp comprising:
      generating, with an inverting amplifier circuit, a second feedback signal according to the output signal of the first op-amp; and
      transmitting the second feedback signal to the non-inverting terminal of the first op-amp.

10. The method according to claim 9, wherein: the first input signal and the second input signal form a differential pair; and the output signal is a single-ended output.

11. The method according to claim 9, the amplitude of the first input signal is substantially zero and the amplitude of the second input signal is substantially zero.

12. The method according to claim 9, wherein the inverting amplifier circuit comprises:
   a second operational amplifier comprising:
      an inverting input terminal connected to an output terminal of the first operational amplifier;
      a non-inverting terminal connected to a reference voltage; and
      an output terminal connected to the non-inverting terminal of the first operational amplifier.

13. The method according to claim 9, further comprising adjusting a gain of the inverting amplifier circuit.

14. An audio system, comprising:
   an integrated circuit configured to receive a first analog input signal, and comprising:
      processing circuitry configured to convert the first analog input signal into a digital signal; and
      a digital-to-analog converter connected to the processing circuitry and comprising:
         a digital circuit configured to process the digital signal; and
         an analog circuit connected to an output terminal of the digital circuit, and comprising:
            a switched-capacitor circuit; and
            a output buffer comprising:
               a first operational amplifier comprising:
                  a non-inverting input terminal;
                  an inverting input terminal; and
                  an output terminal to transmit a second analog signal; and
               a second operational amplifier comprising:
                  an inverting input terminal connected to the output terminal of the first operational amplifier; and
                  an output terminal connected to the non-inverting terminal of the first operational amplifier;
   a power amplifier connected to an output terminal of the output buffer and configured to increase a gain of the second analog signal; and
   a speaker in communication with the amplifier and responsive to the second analog signal.

15. The audio system according to claim 14, wherein the output buffer further comprises:
   a first resistor connected between the output terminal of the second operational amplifier and the inverting terminal of the second operational amplifier; and a first capacitor connected between the output terminal of the second operational amplifier and the inverting terminal of the second operational amplifier, wherein the capacitor is connected in parallel with the resistor.

16. The audio system according to claim 14, further comprising a second resistor and a second capacitor; wherein:
the second resistor and the second capacitor are connected directly between the output terminal of the second op-amp and the non-inverting terminal of the first op-amp; and
the second resistor and the second capacitor are connected in parallel with each other.

17. The audio system according to claim 14, wherein the second op-amp further comprises a non-inverting input terminal connected to a reference voltage.

18. The audio system according to claim 14, further comprising a second resistor connected directly between the output terminal of the first op-amp and the inverting terminal of the second op-amp.

19. The audio system according to claim 14, further comprising:
a second resistor connected between the output terminal of the first op-amp and the inverting terminal of the first op-amp; and
a second capacitor connected between the output terminal of the first op-amp and the inverting terminal of the first op-amp, wherein the second capacitor is connected in parallel with the second resistor.

20. The audio system according to claim 14, further comprising:
a second resistor connected to the output terminal of the second op-amp; and
a second capacitor connected to the output terminal of the second op-amp and the non-inverting terminal of the first op-amp;
wherein the second resistor is further connected to:
the inverting terminal of the first op-amp via a third capacitor and a third resistor; and
the non-inverting terminal of the first op-amp via a fourth resistor.

* * * * *